United States Patent [19]

Schweiss

[11] Patent Number: 5,155,065
[45] Date of Patent: Oct. 13, 1992

[54] UNIVERSAL PAD PITCH LAYOUT

[75] Inventor: Helmut Schweiss, Phoenix, Ariz.

[73] Assignee: Motorola, Inc., Schaumburg, Ill.

[21] Appl. No.: 852,117

[22] Filed: Mar. 16, 1992

[51] Int. Cl.⁵ ............................................ H01L 21/60
[52] U.S. Cl. ..................................... 437/209; 437/51; 437/211; 437/220; 357/70
[58] Field of Search ............... 437/209, 211, 215, 210, 437/51, 220, 52; 357/70, 79, 80

[56] References Cited

U.S. PATENT DOCUMENTS

| | | | |
|---|---|---|---|
| 4,627,151 | 12/1986 | Mulholland et al. | 437/220 |
| 4,674,175 | 6/1987 | Stampfli | 437/209 |
| 4,685,998 | 8/1987 | Quinn et al. | 357/70 |
| 4,709,468 | 12/1987 | Wilson | 437/209 |
| 4,743,956 | 5/1988 | Olla et al. | 437/220 |
| 5,015,600 | 5/1991 | Livermore et al. | 437/51 |
| 5,023,202 | 6/1991 | Long et al. | 437/220 |
| 5,034,349 | 7/1991 | Landis | 437/209 |
| 5,039,628 | 8/1991 | Carey | 437/209 |

Primary Examiner—Brian E. Hearn
Assistant Examiner—Kevin M. Picardat
Attorney, Agent, or Firm—Joe E. Barbee

[57] ABSTRACT

A method for configuring a plurality of pads (305) on a semiconductor die (300) to accommodate more than one pad pitch. Pad sizes and pad to pad spacings are adjusted to achieve the pad configuration. A pattern may form in the pad configuration. The pattern is repeated to meet the number of pads needed in an application. Even though the pad pitch changes to accommodate various sizes of I/O's and package lead pitches, a fixed contact pitch probe card can be used for various pad pitches and patterns.

19 Claims, 5 Drawing Sheets

UNIVERSAL PAD PITCH LAYOUT

BACKGROUND OF THE INVENTION

This invention relates, in general, to pad arrays, and more particularly to pad configurations which can accommodate more than one pad pitch.

The pad array is an external interface of a semiconductor chip for coupling signals to the semiconductor chip. Testing semiconductor die at wafer probe is performed with a probe card having probe needles which contact the semiconductor die on the pad array. Each probe needle contacts a pad on the semiconductor die. Most semiconductor die are placed in some form of package. A package has electrical interconnects which couple to the pads on the semiconductor die.

High pad counts on semiconductor die are expected as device densities and circuit functionality increase due to processing advances. Pad counts are limited by several factors. First, a minimum pad size is determined by package interconnect or probe card needles. The pad size must be large enough to support adequate contact and insure good yield. Second, pad spacing or pad pitch (the distance between pads) must be wide enough to prevent package interconnect or probe card needles from shorting together. Finally, the number of pads is limited by physical space on the semiconductor die. Staggering pads is commonly used to provide minimum pad sizes at a minimum pad pitch. It should be noted that package assembly yields decrease and probe card costs increase with increasing pad counts due to the added complexities involved with finer geometries.

Defacto standards have been established on pad size and pad pitch. Standardization is mainly due to the large number of semiconductor, package, and probe card vendors which sell products to each other and also to keep costs down. Pad pitch has been standardized in 25 micron increments. For example, probe cards can be purchased which contact semiconductor pads having 75 micron, 100 micron, 125 micron, 150 micron, etc. pad pitches. Semiconductor die are built having a predetermined pad size and pad pitch. Probe cards and packages are built to couple to the predetermined pad size and pad pitch.

All semiconductor manufacturers offer a uniform pad size with a uniform pad pitch, this is not efficient when offering a wide variety of packages, process technologies, and different pad counts. For example, a gate array manufacturer offers several different size gate arrays for a given process flow. Each process flow will have a different minimum pad size and pad pitch. Within a given process flow different pad sizes and pad pitches may be necessary to accommodate different styles of semiconductor packages. Each different gate array (from a family of gate arrays) corresponding to a specific process flow will have a unique probe card built for testing purposes. A great deal of time and money can be spent developing different gate arrays, packages, probe cards, and modifying computer aided design tools to meet customers varying pad configuration needs.

Customers needing to vary pad pitch or pad size on a gate array chip (for design or packaging reasons) have no alternatives other than building a full custom array having the desired pad sizes and pad pitches. A custom probe card and custom package may also have to be built, driving up costs and development time to intolerable levels.

A core limited gate array design is a design wherein the interior core of a die is fully utilized but not all pads available are used. Packaging yields are typically a function of pin count and the minimum spacing between package to pad interconnect. High pin counts and smaller interconnect spacings will have the lowest yields. Packaging yields could be increased if non-minimum pad spacings could be used in a core limited gate array design.

A pad limited design is a design wherein the interior core of a die is not fully utilized but all the pads are used. A worst case scenario for a core limited design occurs when a user must move up to a larger gate array size for extra pads even though most of the interior core of the gate array will go unused. Because the pad size and pad pitch is fixed, adjustments cannot be made to take advantage of varying interconnect technology without redesigning the gate arrays.

There is very little interchangeability between process flows. Packages developed for a specific pad pitch and pad size, typically, cannot be used in the next generation process flow (which will have a different pad size and pad pitch). Probe cards have even less chance for use in different process flows.

Uniform pad size and pad pitch severely limits flexibility, increases costs, and does not take advantage of previous developments. It would be of some importance to provide a pad size and pad pitch configuration which is adjustable. An adjustable pad array would shorten development time, minimize need for customization, reduce cost, allow current developments to be used with next generation process flows, and give customers a choice on using different package technologies.

SUMMARY OF THE INVENTION

Briefly stated, this invention is a method for configuring pads on a semiconductor die so contact to the pads can be made for a plurality of predetermined pad pitches. Uniform pads with a uniform pad pitch are used as a starting point to configure the pads. The pads are arranged in a row. Pad widths of predetermined pads in the row of pads are adjusted to accommodate the predetermined pad pitches. Further adjustments can be made by varying pad pitch between pads in the row of pads.

DETAILED DESCRIPTION OF THE DRAWINGS

Figure 1:
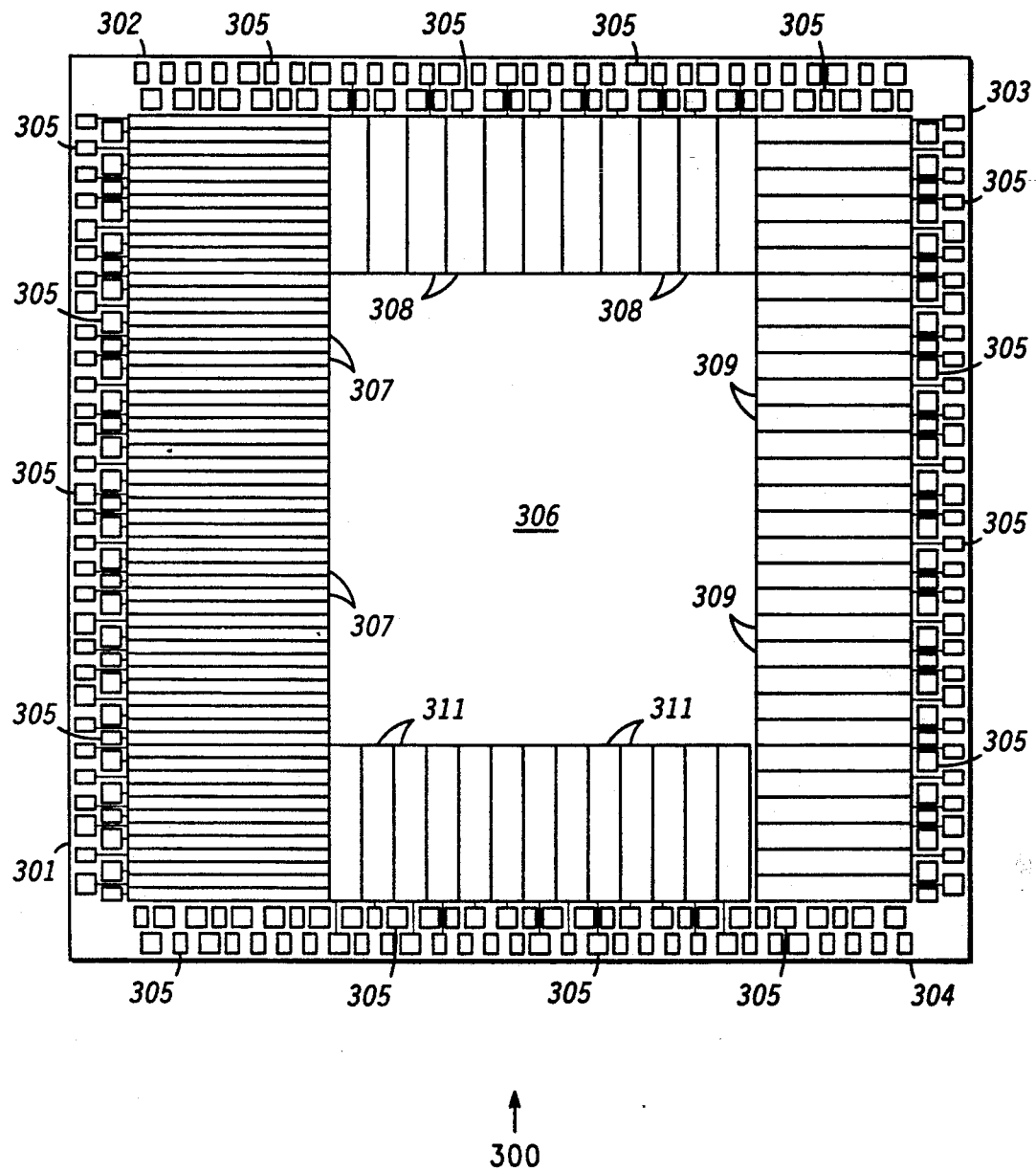
FIG. 1 is an illustration of a semiconductor die showing a pad ring, input/output cell sites, and a main circuit area in accordance with the present invention.

FIG. 1 illustrates a semiconductor die 300 with a ring of pads on the die periphery using a universal pad pitch layout in accordance with the present invention. Sides 301, 302, 303, and 304 of semiconductor die 300 each has a plurality of pads 305 in a universal pad pitch layout configuration to couple signals into and out of semiconductor die 300. Input and output circuitry (I/O) are used to buffer and control the flow of information into and out of semiconductor die 300. Area or space for an input or output circuit is located in an I/O site. I/O sites 307 are used with pads 305 on side 301, I/O sites 308 are used with pads 305 on side 302, I/O sites 309 are used with pads 305 on side 303, and I/O sites 311 are used with pads 305 on side 304. A main circuit area 306 is an area containing circuitry configured for a customer specific application. In a gate array application main circuit area 306 will have unconnected transistors. A customer netlist defines the connections of the transistor array which forms a customer specific circuit. A signal entering or leaving main circuit area 306 must couple to an I/O site.

The number of pads 305 which are used and the type of I/O circuitry which is needed varies with each customer specific circuit. In the preferred embodiment, the ring of pads 305 are fixed and do not change in size, location, and number. I/O circuitry and I/O site locations are chosen for each customer specific circuit. FIG. 1 illustrates a configuration of I/O sites which can be accommodated by a fixed pad ring gate array using the universal pad pitch layout. Note how a different sized I/O site is used on each side of semiconductor die 300, yet each I/O site aligns to a corresponding pad location for easy coupling. A pad ring which has pads of uniform size and uniform spacings between pads does not easily accommodate different width I/O sites. Universal pad pitch layout will also allow intermixing of different width I/O sites and still align to a corresponding pad location. For example, an I/O circuit is typically built in the smallest width I/O site which can accommodate the circuit. Input circuits, various drive strength output circuits, tri-state I/O, and I/O for receiving signals from different technologies (ECL, GTL, TTL, CMOS, BICMOS, etc.) are just a few of the different types of I/O cells which are used in a design. The universal pad pitch layout accommodates a plurality of predetermined width I/O sites. Building the different I/O circuits in the smallest I/O width maximizes the number of I/O which can be used for a given series of pads 305. Intermixing different types of I/O, each having different widths, increases designer latitude in architecting complex designs.

A signal external to the die couples to a pad through any suitable interconnect (such as a metal interconnect for electrical signals or a fiber optic interconnect for optical signals). Likewise, a signal leaving the die couples from a pad to an external element through an interconnect. The pad also acts as a mechanical contact point for interconnect (a wire interconnect is physically bonded to a pad). Each I/O pad is coupled to a corresponding I/O site. I/O signals couple to main circuit area 306 through circuitry in I/O sites.

Two rows of fixed pads 305 are placed on each side of semiconductor die 300. The two rows of pads 305 are staggered so interconnect is easily coupled from a pad to a corresponding I/O site. I/O sites 307 are minimum width I/O sites. Each minimum width I/O site corresponds to a pad on side 301. I/O sites having a larger width would not align to each pad. Input circuitry usually requires the smallest width I/O site and would correspond to I/O sites 307. High drive outputs require a large I/O site and would correspond to I/O sites 308.

Note that each I/O site has a corresponding pad. Unused pads 305 are typically dedicated to power and ground.

External interconnect which couples to the pads 305 on semiconductor die 300 (such as package to pad interconnect) must be capable of contacting each pad without shorting together. The spacing of adjacent interconnect is commonly referred to as pad pitch. The spacing also corresponds to I/O site width since each I/O pad couples to an I/O site. A ring of pads 305 which has a uniform pad size and uniform spacings between pads 305 cannot easily accommodate different pad pitches. The universal pad layout allows pad contact from external interconnect at different pad pitches. This is best illustrated by viewing the pads 305 which couple to the I/O sites on sides 302, 303, and 304. I/O sites 308, 309, and 311 are wider than the minimum width I/O site. The pad pitch (or spacing between interconnect) when contacting the pads 305 corresponding to the I/O sites is uniform but different for each side. Semiconductor package yields correlate to the number of pads 305 which are connected to the package and the minimum spacing (or pad pitch) between the package to pad interconnect. High pad counts and small pad pitch will lead to lower yields. The universal pad pitch layout can be used with pad pitches larger than the minimum width thereby increasing package yields when pad usage allows a wider spacing between interconnect.

Another benefit of the universal pad pitch layout is that a single probe card can be built to test different circuits which have the same pad configuration. For example, a probe card is designed to align and contact all the pads 305 on semiconductor die 300. The probe card couples a tester to semiconductor die 300. Although every pad is contacted by the probe card, the tester is programmed to interface with only the pads 305 needed to test the circuit. If a pad ring which has a uniform pad size and uniform spacings between pads 305 is used to accommodate different pad pitches a different pad ring would have to be designed for each pad pitch thereby increasing cost, development time, and forcing a custom probe card to be designed for each circuit using different pad pitches. The universal pad pitch layout allows the user to design circuits which couple to semiconductor die 300 with different pad pitches without customizing pads 305 or I/O.

Figure 2:
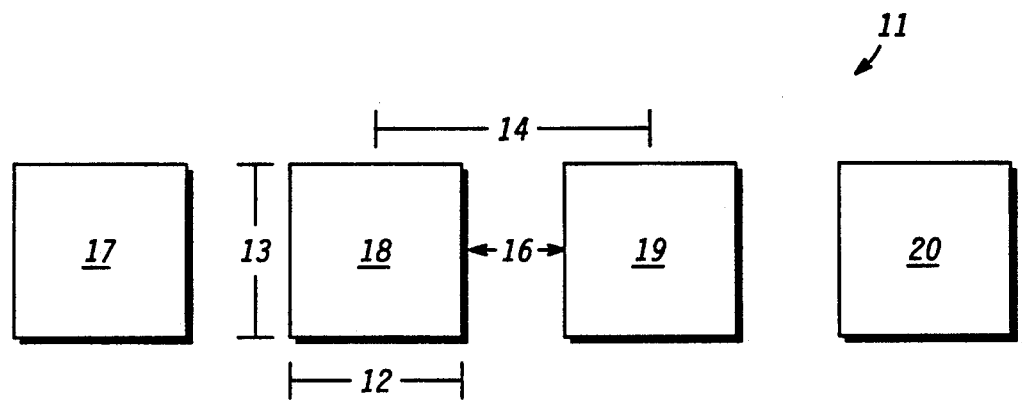
FIG. 2 is an illustration of a sequence of pads with I/O sites useful in understanding the present invention.
Figure 2:
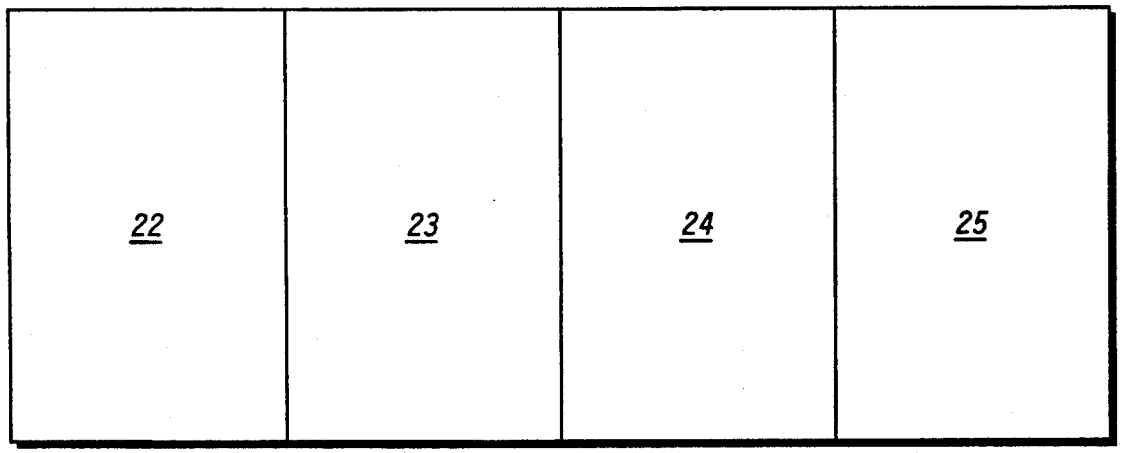

FIG. 2 illustrates a sequence of pads 11 having a uniform pad width and a uniform spacing which is useful for understanding the present invention. Pads 17, 18, 19, and 20 are a limited number of pads used for illustration purposes, wherein an actual semiconductor product such as a gate array hundreds of pads may be needed. The pads are the interface between internal circuitry on the semiconductor die and external components such as a probe card or a semiconductor package. The pads couple signals to and from the semiconductor die as well as providing a physical contact point for a wire bond, solder bump, probe card, etc.

Pads 17, 18, 19, and 20 have a characteristic pad width and pad height. Pad width and pad height is illustrated on pad 18. Pad width is shown by a bracketed line 12. Pad height is shown by a bracketed line 13. Pads 17, 18, 19, and 20 are drawn having identical pad widths and pad heights. Gate arrays are prefabricated semiconductor wafers having semiconductor die with arrays of transistors which can be metalized together to form a specific circuit design. Building gate arrays up to metalization allows quick cycle times in fabrication. Standardization is the key to building efficient gate arrays. Pads used on semiconductor chips such as gate arrays have uniform pad widths and uniform pad heights which are designed to interface with specific packages and probe cards. Constantly changing pad configurations would add development time, production time, and cost to gate array products.

Pad width and pad height do not have to be identical. Pad width and pad height are chosen to insure that external interconnect can contact a corresponding pad for passing signals from a semiconductor die to an external element.

Pad pitch is a measure of the distance between the centerpoints of two pads. A bracketed line 14 illustrates a pad pitch between pad 18 and pad 19. Pad pitch used on semiconductor die such as gate arrays have pads spaced at a uniform pad pitch. External elements such as probe card needles and semiconductor package interconnect align to corresponding pads to make contact, thus external interconnect aligns to pads at a pad pitch which corresponds to pad pitch on the semiconductor die. Pad pitch used in context to the universal pad pitch layout will refer to a uniform spacing of an external interconnect medium (such as probe card needles, or semiconductor package to pad interconnect) which aligns too and contacts pads on a semiconductor die.

A pad spacing is illustrated by double headed arrow 16 which is the distance between pad 18 and pad 19. Both the pad pitch and pad spacing are used as a measure of the proximity of one pad to one another. Pads 17, 18, 19, and 20 are drawn having uniform pad pitches and uniform pad spacings which is typical for pads used on a gate array semiconductor die.

Pads typically couple to input, output or bidirectional I/O circuitry on a semiconductor chip by interconnecting a pad with one or more I/O cells on a semiconductor chip. Multiple I/O cells in parallel are used to increase drive strength. I/O circuitry is normally placed in close proximity to the pads. I/O site width is made to lineup with a pad pitch so an I/O site corresponds to a pad. The preferred ratio is 1:1 (one pad to one I/O site) with the capability to change the pad pitch and I/O cell width to adapt to the particular requirements needed. This cannot be achieved with a fixed pad pitch.

A 1:1 ratio between pad and pad site is illustrated by I/O sites 22, 23, 24, and 25. I/O site 22 corresponds with pad 17, I/O site 23 corresponds with 18, I/O site 24 corresponds with pad 19, and I/O site 25 corresponds with pad 20. The width of I/O sites 22, 23, 24, and 25 is the pad pitch illustrated by bracketed line 14 which allows them to maintain a constant pad to I/O site spacing relationship. The present invention allows different I/O site widths to be used while retaining a pad to I/O site spacing relationship.

Figure 3:
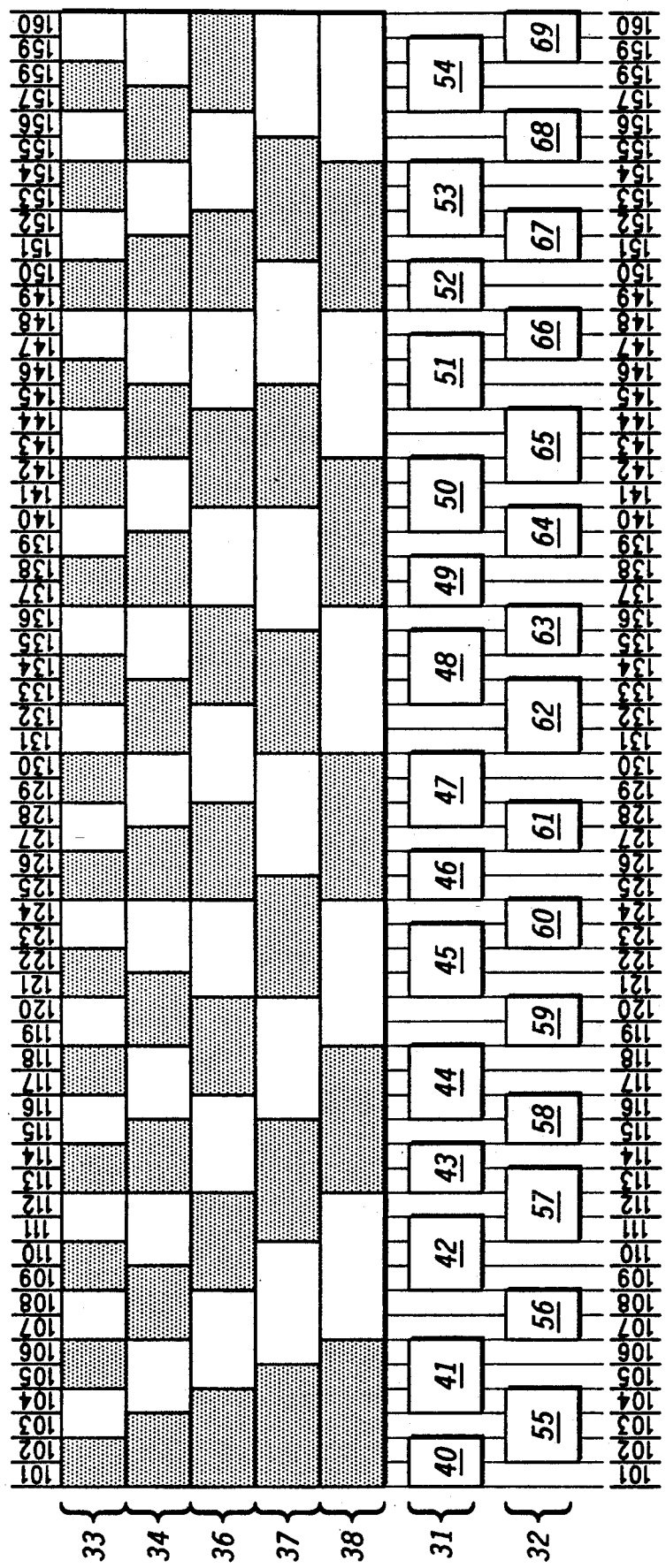
FIG. 3 is an illustration of the preferred embodiment of this invention.

FIG. 3 illustrates the preferred embodiment of a universal pad pitch layout which accommodates a base 50micron pad pitch and also pad pitches at 25 micron increments up to 150 microns. 30 pads are shown in FIG. 3 which forms a unique pattern, this pattern can be repeated until the number of pads needed is satisfied. For example, FIG. 1 uses the unique pattern repeated once (60 total pads) on each side of the semiconductor die. There are many advantages in having a pad configuration which can be contacted at different pad pitches. First, semiconductor packages which were designed for pad pitches larger than 50 microns (75 micron, 100 micron, 125 micron, etc.) can be used with the universal pad pitch layout. Second, a single probe card (for testing at wafer probe) can be used to test different circuits (having an identical fixed pad ring) even if the circuits used different pad pitches. The probe card contacts every pad in the fixed pad ring, each circuit has a predetermined list of pads which are used and this information is passed to a tester which activates only the predetermined list of pads. Third, I/O sites can be made at widths which correspond to the different pad pitches available. The I/O sites will line up with a corresponding pad simplifying interconnect from pad to I/O site and allows increased flexibility in designing different types of I/O circuits. Fourth and finally, the universal pad pitch layout allows different pad pitches (and different width I/O sites) to be used in a sequence of pads.

A minimum pad width of 50 microns with the base 50 micron pad pitch is used and will accommodate next generation probe cards and packages. In a preferred embodiment, all pads have a 70 micron height. Two rows of pads are needed to achieve the 50 micron pad pitch. The pad rows are staggered which simplifies interconnect to I/O cell sites.

A grid size of 25 microns is provided to show pad widths and pad spacings in each row of pads. The grids are numbered from grid 101 to grid 160 and the lines which separate each grid are extended through to the pad locations. All pad widths and pad spacings are integer multiples of the grid size. Although the pad configuration allows variable pad pitches in increments of 25 microns (from the minimum 50 micron pad pitch), descriptions of a pad pattern uses pad widths and pad spacings. Variations in pad size would make the description of the pad pattern difficult if measured from pad center to pad center.

Two rows of pads in a staggered configuration are shown in FIG. 3. A first row of pads 31 and a second row of pads 32 each has 15 pads in a unique pattern of pad widths and pad spacings. Predetermined pads in each row are adjusted from the minimum pad width in increments of the grid size to accommodate the different pad pitches. In the preferred embodiment, 50 micron wide pads and 75 micron wide pads are used, all pads have a uniform 70 micron height.

The different pad pitches (50 micron, 75 micron, 100 micron, 125 micron, and 150 micron) which are accommodated by the preferred embodiment of the universal pad pitch layout refers to spacings between external interconnect such as semiconductor package to pad interconnect when contacting pads. The external interconnect aligns to and mates to pads on a semiconductor die. External elements spaced in 50 micron, 75 micron, 100 micron, 125 micron, and 150 micron increments can be aligned to contact pads using the preferred embodiment of the universal pad pitch layout. Pad pitch which was previously defined as the distance between the center points of two pads in FIG. 2 is not applicable for the universal pad pitch layout because an external interconnect aligned to pads of FIG. 3 at a 50 micron, 75 micron, 100 micron, 125 micron or 150 micron pad pitch will not align to a 75 micron pad center. In fact, the 75 micron pad width is increased in width 25 microns from the 50 micron pad width to allow different alignments to the 75 micron pad for different pad pitches. The 75 micron wide pad can be contacted 25 microns from either side of the pad (leaving a 50 micron distance to the other side). Note that a 50 micron wide pad when contacted in the center has a distance of 25 microns to either side of the pad. Although the 75 micron wide pad is contacted off center it still has a minimum 25 micron distance to the pad side just as is the case when making contact to the 50 micron wide pad.

Further modifications are made by changing pad to pad spacings in each row. In the preferred embodiment, 25 micron spacings and 50 micron spacings are used. Changing the pad to pad spacing is a further degree of freedom which can be used to accommodate the different pitches chosen for a pad configuration. In the preferred embodiment, the 25 micron and 50 micron spacings are used to adjust the stagger between the two pad rows. A unique pattern of pad sizes and pad spacings is formed for each row. The unique patterns of each row are adjusted to one another forming two unique pad patterns which correlate to one another to provide pad contact at more than one pad pitch. The unique pad patterns of each row combine to generate a group of pads which can accommodate contact at a minimum 50 micron pad pitch and larger pad pitches in increments of 25 microns.

The unique pattern of pad widths and pad spacings for first row of pads 31 and second row of pads 32 of FIG. 3 will be described using grid 101 as reference point and finishing at grid 160.

A row of 50 micron wide boxes 33, a row of 75 micron wide boxes 34, a row of 100 micron wide boxes 36, a row of 125 micron wide boxes 37, and a row of 150 micron wide boxes 38 are shown to represent locations of different width I/O sites with respect to the unique pattern of pads. An I/O site represents an area where input or output circuitry can be placed. Input and output circuitry vary in size and are designed to fit within one of the different I/O site widths. Although as will become more apparent hereinafter, the universal pad pitch layout will allow the use of different width I/O sites yet maintain a spatial correspondence between a pad and a corresponding I/O site. Each row of boxes (33, 34, 36, 37 and 38) starts at grid 101 and finishes at grid 160. Each box represents an I/O site. The I/O site width corresponds to the chosen pad pitch. For example, a 50 micron pad pitch would have a 50 micron wide I/O site or a 125 micron pad pitch would have a 125 micron wide I/O site, thereby maintaining a direct spacing relationship between pad and I/O site for each pad pitch used. Alternate boxes in each row have a stipple pattern to clarify the relationship between I/O cell sites and the pads. Spacings between pads allow interconnect from the staggered pads to reach the I/O cell sites.

The unique pattern of pads and spacings formed in first row of pads 31 can be described by listing pads and spacings starting from grid 101. All pads are listed by pad width (example, a 50 micron pad=a pad which has a 50 micron width) and all spacings refer to the distance between two pads. First row of pads 31 starts at grid 101 with a 50 micron pad 40, 25 micron space, 75 micron pad 41, and a 50 micron space which finishes at grid 108. A pattern follows, starting at grid 109, comprising a 75 micron pad, 25 micron space, 50 micron pad, 25 micron space, 75 micron pad, and 50 micron space. This three pad pattern with three spaces is repeated a total of four times starting from grid 109 and finishing at grid 156. Each group of three pads and three spaces is identified by the pads in the group. Starting from grid 109, the four groups of pads are pads 42, 43, and 44, pads 45, 46, and 47, pads 48, 49, and 50, and pads 51, 52, and 53 which finish at grid 156. The unique pattern of first row of pads 31 ends with a 75 micron pad 54 starting at grid 157 and ends with a 25 micron space at grid 160.

The unique pattern of pads and spacings formed in second row of pads 32 must be listed in sequence. The thirty pads and spacings do not have any apparent repeating pattern. Second row of pads 32 starts at grid 101 with a 25 micron space, 75 micron pad 55, 50 micron space, 50 micron pad 56, 50 micron space, 75 micron pad 57, 25 micron space, 50 micron pad 58, 50 micron space, 50 micron pad 59, 50 micron space, 50 micron pad 60, 50 micron space, 50 micron pad 61, 50 micron space, 75 micron pad 62, 25 micron space, 50 micron pad 63, 50 micron space, 50 micron pad 64, 25 micron space, 75 micron pad 65, 50 micron space, 50 micron pad 66, 50 micron space, 50 micron pad 67, 50 micron space, 50 micron pad 68, 50 micron space, and a 50 micron pad 69 which finishes at grid 160.

Note how row of boxes 33, 34, 36, 37, and 38 align at grid 101 and each aligns at grid 160. The unique pattern of first row of pads 31 and second row of pads 32 would repeat if it were continued past grid 160. The universal pad pitch layout can easily accommodate more than 30 pads by repeating first row of pads 31 and second row of pads 32, on a side of a semiconductor chip, until the number of pads needed is reached.

Contact from an external element (probe card or semiconductor package interconnect) to the universal pad pitch layout at a 50 micron pad pitch will contact every pad. Contacts from the external element corresponding to 50 micron wide pads in the universal pad pitch layout should align to the pad centers. Contacts from the external element corresponding to 75 micron wide pads will contact the 75 micron wide pad off center. Pads 75 microns wide contacted off center will align to the external element contact with a minimum 25 micron space on either side of the point of contact.

All pads in the universal pad pitch layout are used when external interconnect (such as semiconductor package to pad interconnect) is aligned to the pads and spaced at a 50 micron pad pitch. External interconnect spaced at 75 microns, 100 microns, 125 microns, and 150 microns will not use all the pads available but will align to an I/O site of the same width. Combinations of the different pad pitches can be used as long as the I/O sites do not overlap each other, thereby insuring each I/O site aligns with a pad. The universal pad pitch layout provides three immediate benefits. First, pad pitch is variable which allows a user to choose an appropriate pad pitch for a specific application. Second, a single probe card built at a 50 micron pad pitch can be used to test all acceptable pad pitches (50 microns, 75 microns, 100 microns, 125 microns, and 150 microns) saving development time and money. Third, packaging yields are related to the complexity of pad to package interconnect. Typically, smaller pad pitches correlate with lower yields. If a design is not pad limited the universal pad pitch layout allows spacings at pad pitches larger than the 50 micron pad pitch (75 micron, 100 micron, 125 micron, and 150 micron) thereby increasing assembly yields.

Figure 4:
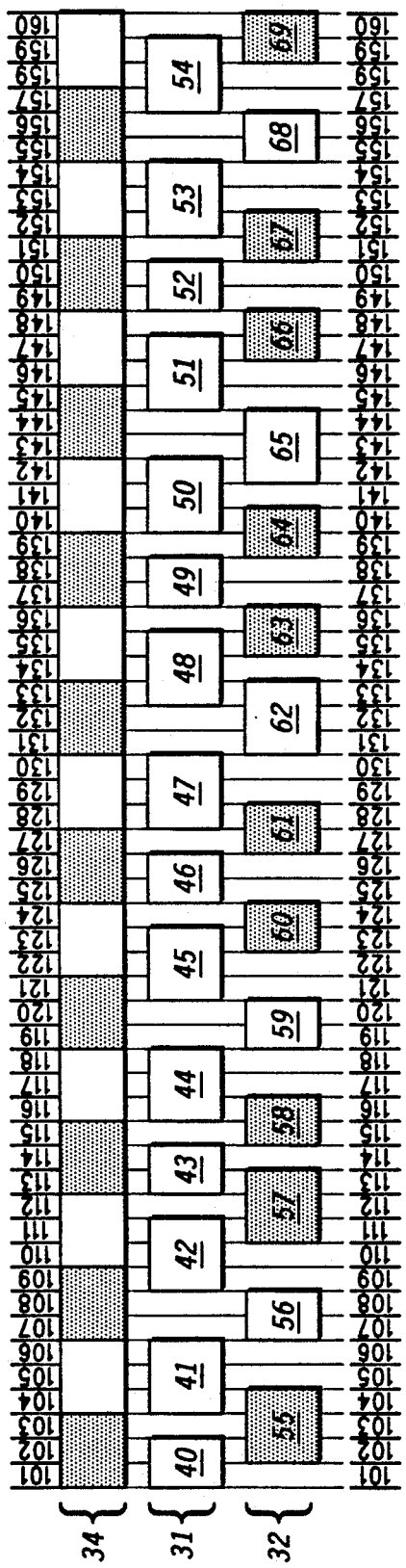
FIG. 4 is an illustration showing pads used at a 75 micron pad pitch.

FIG. 4 is an illustration of the universal pad pitch layout shown in FIG. 3 at a 75 micron pad pitch. The pads which are contacted by an external interconnect (such as semiconductor package to pad interconnect) having a 75 micron pad pitch are shown without a stipple pattern. The pad areas having a stipple pattern are pads that are not used at the 75 micron pad pitch. Row of boxes 34 illustrates corresponding 75 micron wide I/O sites in relation to the pads identified for use at the 75 micron pad pitch. Alternate boxes in row of boxes 34 have a stipple pattern to clarify the relationship between I/O cell sites and the pads used at the 75 micron pad pitch. The external element contacts align to the center of all 50 micron wide pads in first row of pads 31 and second row of pads 32 used at the 75 micron pad pitch. The pads in the universal pad pitch layout used at the 75 micron pad pitch are listed in sequential order starting at grid 101, they are pads 40, 41, 56, 42, 43, 44, 59, 45, 46, 47, 62, 48, 49, 50, 65, 51, 52, 53, 68, and pad 54. The pattern is repeated to accommodate the number of pads needed on a side of the semiconductor chip.

Figure 5:
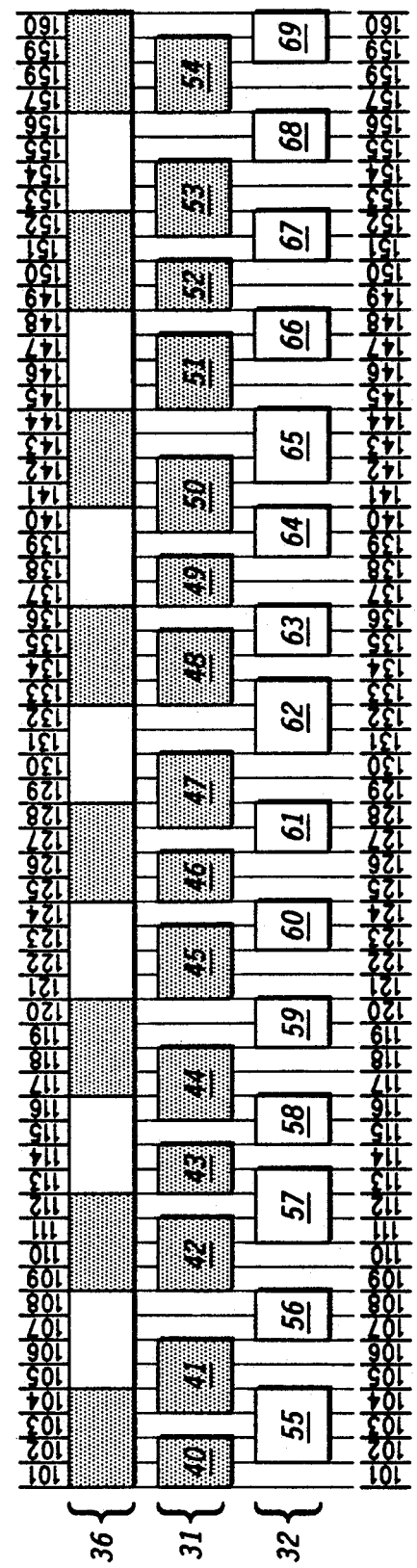
FIG. 5 is an illustration showing pads used at a 100 micron pad pitch.

FIG. 5 is an illustration of the universal pad pitch layout shown in FIG. 3 at a 100 micron pad pitch. One group of pads which are contacted by an external element (such as semiconductor package to pad interconnect) having a 100 micron pad pitch are pads shown without a stipple pattern. Row of boxes 36 illustrates corresponding 100 micron wide I/O sites in relation to the pads identified for use at the 100 micron pad pitch. Alternate boxes in row of boxes 36 have a stipple pattern to clarify the relationship between I/O cell sites and the pads used at the 100 micron pad pitch. The external element contacts align to the center of all 50 micron wide pads in first row of pads 31 or second row of pads 32 used at the 100 micron pad pitch. Two groups of pads in the universal pad pitch layout used at the 100 micron pads 40-54 (shown with stipple pattern) or all of second row of pads 32 which comprises pads 55-69. This simple relationship occurs because the 100 micron pad pitch is an even multiple of the minimum 50 micron pad pitch.

Figure 6:
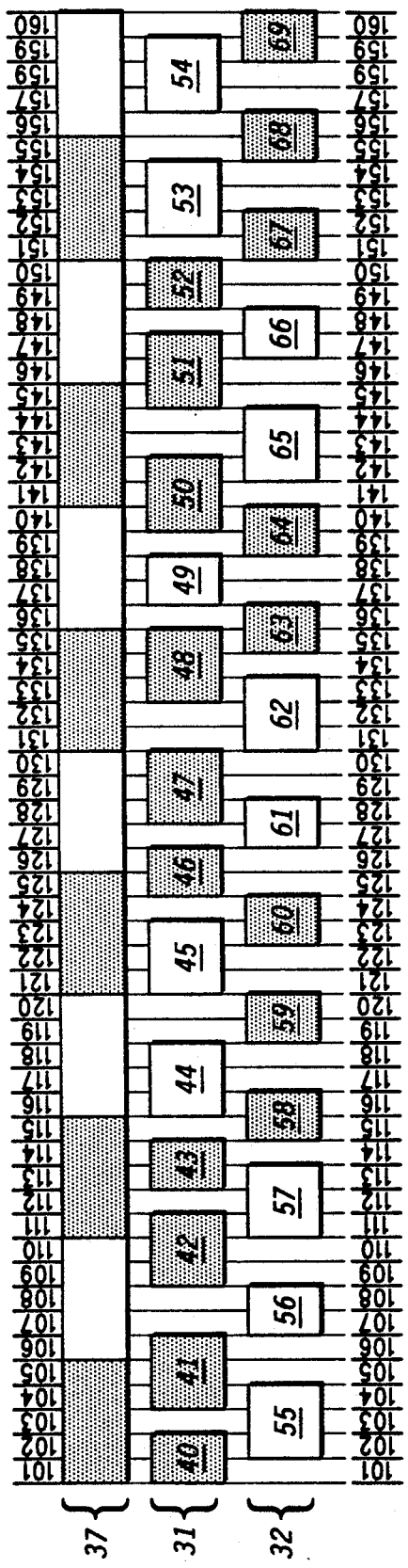
FIG. 6 is an illustration showing pads used at a 125 micron pad pitch.

FIG. 6 is an illustration of the universal pad pitch layout shown in FIG. 3 at a 125 micron pad pitch. The pads which are contacted by an external interconnect (such as semiconductor package to pad interconnect) having a 125 micron pad pitch are shown without a stipple pattern. The pad areas having a stipple pattern are pads that are not used at the 125 micron pad pitch. Row of boxes 37 illustrates corresponding 125 micron wide I/O sites in relation to the pads identified for use at the 125 micron pad pitch. Alternate boxes in row of boxes 37 have a stipple pattern to clarify the relationship between I/O cell sites and the pads used at the 125 micron pad pitch. The external element contacts align to the center of all 50 micron wide pads used in first row of pads 31 and second row of pads 32 at the 125 micron pad pitch. The pads in the universal pad pitch layout used at the 125 micron pad pitch are listed in sequential order starting at grid 101, they are pads 55, 56, 57, 44, 45, 61, 62, 49, 65, 66, 53, and pad 54. The pattern is repeated to accommodate the number of pads needed on a side of the semiconductor chip.

Figure 7:
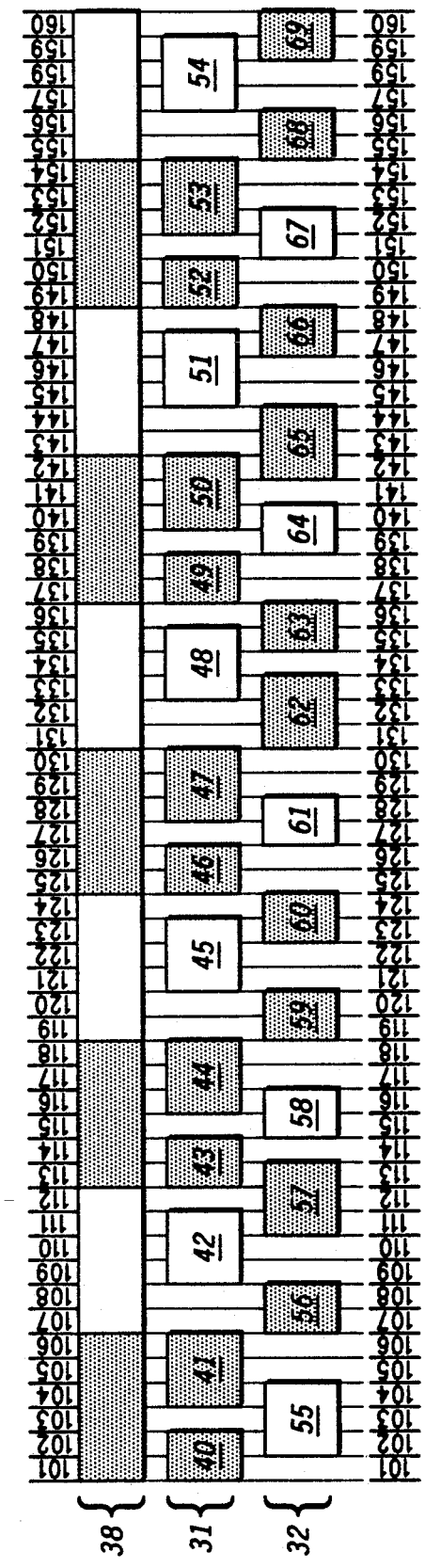
FIG. 7 is an illustration showing pads used at a 150 micron pad pitch.

FIG. 7 is an illustration of the universal pad pitch layout shown in FIG. 3 at a 150 micron pad pitch. The pads which are contacted by an external interconnect (such as semiconductor package to pad interconnect) having a 150 micron pad pitch are shown without a stipple pattern. The pad areas having a stipple pattern are pads that are not used at the 150 micron pad pitch. Row of boxes 38 illustrates corresponding 150 micron wide I/O sites in relation to the pads identified for use at the 150 micron pad pitch. Alternate boxes in row of boxes 38 have a stipple pattern to clarify the relationship between I/O cell sites and the pads used at the 150 micron pad pitch. The external element contacts align to the center of all 50 micron wide pads used in first row of pads 31 and second row of pads 32 at the 150 micron pad pitch. The pads in the universal pad pitch layout used at the 150 micron pad pitch are listed in sequential order starting at grid 101, they are pads 55, 42, 58, 45, 61, 48, 64, 51, 67, and pad 54. The pattern is repeated to accommodate the number of pads needed on a side of the semiconductor chip.

The universal pad pitch layout can be used for accommodating different pad pitches anywhere on a semiconductor chip. In the preferred embodiment, a semiconductor gate array chip will have pads on each side of the chip, pads using this configuration can also be placed on the interior of the die. Where pads are placed on a semiconductor chip using the universal pad pitch layout is more of a function of the medium used to contact the pads (such as a probe card or semiconductor package to pad interconnect). A ring of pads is formed on the periphery of the die by placing two rows of pads on each side of the die. Each side would use the universal pad pitch layout illustrated in FIG. 3, which in turn is tailored to the pad pitch needed, as shown in FIGS. 4 thru 7.

For the semiconductor die 300 illustrated in FIG. 1 it was chosen to isolate different types of input and output circuitry from each other by placing them on an individual side of the die. I/O sites 307 corresponding to the pads on side 301 are 50 microns wide. The small size of I/O sites 307 are used for input circuitry. I/O sites 308 corresponding to pads on side 302 are 150 microns wide. The large size of I/O sites 308 are used for large power devices which drive off chip loads. I/O sites 309 corresponding to the pads on side 303 are 100 microns wide. The intermediate size of I/O sites 309 could be used for low power output devices. I/O sites 311 corresponding to pads on side 304 are 125 micron wide. The intermediate size of I/O sites 311 could be used for bidirectional I/O.

Power and ground requirements vary depending on the type of I/O used. Extra unused pads are used for power and ground connections for I/O cells or an internal power and ground ring for core circuitry.

The universal pad pitch layout is not confined to isolating pad pitches to a specific area. It is possible to interleaf pad pitches in any combination. There may be many situations where it is critical for a design to have 50, 75, 100, 125, and 150 micron pad pitches within the same side of a die. This would be impossible to do if a die used a uniform pad size and pad spacing.

By now it should be appreciated that there has been provided a universal pad pitch layout for accommodating more than one pad pitch. The universal pad pitch layout provides similar pad densities as standard pad approaches yet can accommodate more than one pad pitch. Benefits provided by the universal pad pitch layout are reduced development time (custom probe cards are not needed for different pad pitches), increased yields when a design is not pad limited (using a larger pad pitch), allows customization of I/O cells due to the availability of different width I/O sites which can be intermixed with each other, and can increase customer flexibility when integrated into a computer aided design system (for integrated circuit design). Also the universal pad pitch layout allows the use of a single fixed pitch probe card that can mate to 50, 75, 100, 125, or 150 micron pad pitches and yet the universal pad pitch layout can mate to many of the accepted standard lead pitch packages.

I claim:

1. A universal pad pitch layout method for incrementally varying pad pitches for a fixed row of pads comprising:
   defining a grid size, wherein the grid size is a base unit of measure for pad widths and pad spacings;
   defining a minimum pad width, wherein the pad width is an integer multiple of the grid size;
   defining a uniform pad height;
   defining a minimum pad pitch, wherein the minimum pad pitch is an integer multiple of the grid size;
   forming a row of pads;
   defining an incremental pad pitch, wherein predetermined pads in the row of pads can be contacted at a pad pitch equal to the minimum pad pitch plus an integer multiple of the incremental pad pitch;
   varying the width of predetermined pads in the row of pads by increments of the grid size;
   varying the pad pitch between predetermined pads by increments of the grid size; and
   combining variations in the pad width and the pad pitch to create a pad pattern wherein all pads can be contacted at the minimum pad pitch and predetermined pads can be contacted at the minimum pad pitch plus an integer multiple of the incremental pad pitch.

2. The universal pad pitch layout method for incrementally varying pad pitches for a fixed row of pads of claim 1 further including:
   adding at least another row of pads;
   staggering pads from row to row;
   creating a pad pattern for each row of pads; and
   correlating the pad patterns from each row to create a pad pattern wherein all pads can be contacted at the minimum pad pitch and predetermined pads can be contacted at the minimum pad pitch plus integer multiple of the incremental pad pitch.

3. The universal pad pitch layout method for incrementally varying pad pitches for a fixed row of pads of claim 2 further including:
   repeating the pad patterns of each row to increase pad numbers.

4. The universal pad pitch layout method for incrementally varying pad pitches for a fixed row of pads of claim 3 further including:
   forming a pad ring by repeating the pad patterns of each row around a semiconductor die to increase pad numbers.

5. A method for accommodating variable pad pitches for a fixed row of pads on a semiconductor chip comprising:
   defining a minimum pad size, a minimum pad pitch and an incremental pad pitch;
   defining a unique placement for each pad in a row of pads;
   increasing pad areas of predetermined pads in the row of pads at integer multiples of the incremental pad pitch, wherein each pad area and the unique placement allows more than one pad pitch to be accommodated; and
   providing pads to be used at a predetermined pad pitch, the predetermined pad pitch comprising the minimum pad pitch plus any integer multiple of the incremental pad pitch.

6. The method for accommodating variable pad pitches for a fixed row of pads on a semiconductor chip of claim 5 further including:
   varying pad pitch between pads in the row of pads to create the unique placement of each pad.

7. The method for accommodating variable pad pitches for a fixed row of pads on a semiconductor chip of claim 5 further including:
   repeating the unique placement of pads to accommodate more pads on the semiconductor chip.

8. The method for accommodating variable pad pitches for a fixed row of pads on a semiconductor chip of claim 5 further including:
   adding additional rows of pads to increase pad density, each row of pads having a unique pad placement pattern with varying pad areas.

9. The method for accommodating variable pad pitches for a fixed row of pads on a semiconductor chip of claim 8 further including:
   staggering pads of different pad rows to increase pad density.

10. The method for accommodating variable pad pitches for a fixed row of pads on a semiconductor chip of claim 8 further including:
    correlating the unique pad placement patterns of each pad row to one another to provide a fixed row of pads which accommodates variable pad pitches.

11. The method for accommodating variable pad pitches for a fixed row of pads on a semiconductor chip of claim 7 further including:
    repeating the unique pad placement pattern in each row of pads to accommodate the number of pads needed for the semiconductor chip.

12. A method for configuring pads on a semiconductor die which allows pad contact at more than one pad pitch comprising:
    defining a sequence of pads having a uniform size and a uniform pad pitch; and
    adjusting pad areas of predetermined pads in the sequence of pads to change contact areas of pads;
    forming a unique sequence of pads which can accommodate more than one pad pitch; and
    fixing the unique sequence of pads in a predetermined area on the semiconductor die.

13. The method for configuring pads on a semiconductor die which allows pad contact at more than one pad pitch of claim 12 further including:
    maintaining a uniform pad height through the sequence of pads; and
    adjusting predetermined pad areas by increasing pad width, thereby increasing lateral area of a pad for contact at different pad pitches, wherein the adjusting is done in predetermined grid size increments.

14. The method for configuring pads on a semiconductor die which allows pad contact at more than one pad pitch of claim 12 further including:
    adjusting pad to pad spacings in the unique sequence of pads to accommodate more than one pad pitch.

15. The method for configuring pads on a semiconductor die which allows pad contact at more than one pad pitch of claim 14 further including:
    repeating the unique pad pattern to meet a required number of pads.

16. The method for configuring pads on a semiconductor die which allows pad contact at more than one pad pitch of claim 12 further including:
    forming rows of pads to increase pad density, each row having a predetermined sequence of pads; and
    staggering the rows to simplify interconnect and increase pad density.

17. A method for forming two rows of semiconductor pads which allows semiconductor pad contact at 50, 75, 100, 125, and 150 micron pad pitches comprising:

defining a semiconductor pad height;
defining a semiconductor pad width, wherein a semiconductor pad with is 50 microns wide or 75 microns wide;
defining spacings between adjacent pads as a 25 micron wide space or a 50 micron wide space;
staggering the two rows of semiconductor pads
defining a reference line which aligns the two rows of semiconductor pads to one another;
forming a first row of semiconductor pads, starting at the reference line and listing semiconductor pad widths and semiconductor pad spacings in sequential order, the first row of semiconductor pads comprising a 50 micron wide pad, 25 micron space, 75 micron wide pad, 50 micron space, 75 micron wide pad, 25 micron space, 50 micron wide pad, 25 micron space, 75 micron wide pad, 50 micron space, 75 micron wide pad, 25 micron space, 50 micron wide pad, 25 micron space, 75 micron wide pad, 50 micron space, 75 micron wide pad, 25 micron space, 50 micron wide pad, 25 micron space, 75 micron wide pad, 50 micron space, 75 micron wide pad, 25 micron space, 50 micron wide pad, 25 micron space, 75 micron wide pad, 50 micron space, 75 micron wide pad, and a 25 micron space; and
forming a second row of semiconductor pads adjacent to the first row of semiconductor pads, starting at the reference line and listing semiconductor pad widths and semiconductor pad spacings in sequential order, the second row of semiconductor pads comprising a 25 micron space, 75 micron wide pad, 50 micron space, 50 micron wide pad, 50 micron space, 75 micron wide pad, 25 micron space, 50 micron wide pad, 50 micron space, 50 micron wide pad, 50 micron space, 50 micron wide pad, 50 micron space, 50 micron wide pad, 50 micron space, 75 micron wide pad, 25 micron space, 50 micron wide pad, 50 micron space, 50 micron wide pad, 25 micron space, 75 micron wide pad, 50 micron space, 50 micron wide pad, 50 micron space, 50 micron wide pad, 50 micron space, and a 50 micron wide pad.

18. The method for forming two rows of semiconductor pads which allows semiconductor pad contact at 50, 75, 100, 125, and 150 micron pad pitches of claim 17 further including:
forming all semiconductor pads having a uniform height.

19. The method for forming two rows of semiconductor pads which allows semiconductor pad contact at 50, 75, 100, 125, and 150 micron pad pitches of claim 17 further including:
repeating the sequential order of semiconductor pads and pad spacing of the first and second rows of semiconductor pads to form two rows of pads capable of accommodating a larger number of pads.

* * * * *

UNITED STATES PATENT AND TRADEMARK OFFICE
CERTIFICATE OF CORRECTION

PATENT NO. : 5,155,065

DATED : October 13, 1992

INVENTOR(S) : Helmut Schweiss

It is certified that error appears in the above-identified patent and that said Letters Patent is hereby corrected as shown below:

Column 13, claim 17, line 3, change "with" to --width--.

Column 13, claim 17, line 7, after "pads" insert --;--.

Column 14, claim 19, line 26, change "spacing" to --spacings--.

Signed and Sealed this

Fourteenth Day of June, 1994

Attest:

BRUCE LEHMAN

*Attesting Officer*  *Commissioner of Patents and Trademarks*